(12) United States Patent
Bräysy et al.

(10) Patent No.: US 11,461,609 B1
(45) Date of Patent: Oct. 4, 2022

(54) MULTILAYER STRUCTURE AND METHOD OF MANUFACTURING SUCH

(71) Applicant: TactoTek Oy, Oulunsalo (FI)

(72) Inventors: Vinski Bräysy, Oulunsalo (FI); Mikko Heikkinen, Oulunsalo (FI); Mikko Sippari, Oulunsalo (FI); Pälvi Apilo, Oulunsalo (FI); Ilpo Hänninen, Oulunsalo (FI); Samuli Yrjänä, Oulunsalo (FI); Pasi Korhonen, Oulunsalo (FI); Taneli Salmi, Oulunsalo (FI)

(73) Assignee: TACTOTEK OY, Oulunsalo (FI)

( * ) Notice: Subject to any disclaimer, the term of this patent is extended or adjusted under 35 U.S.C. 154(b) by 0 days.

(21) Appl. No.: 17/704,181

(22) Filed: Mar. 25, 2022

(51) Int. Cl.
*G06K 19/02* (2006.01)
*G06K 19/077* (2006.01)

(52) U.S. Cl.
CPC . *G06K 19/07722* (2013.01); *G06K 19/07705* (2013.01); *G06K 19/07724* (2013.01); *G06K 19/07771* (2013.01)

(58) Field of Classification Search
CPC ...... H05K 1/0269; H05K 1/028; H05K 1/111; H05K 1/118; H05K 1/16; H05K 1/189; H05K 2201/0129; H05K 2201/0397; H05K 2201/09081; H05K 2201/09754; H05K 2203/0228; H05K 2203/1316; H05K 3/0044; G06K 19/077705; G06K 19/077724; G06K 19/07771
USPC ........................................ 235/488, 487, 492
See application file for complete search history.

(56) References Cited

U.S. PATENT DOCUMENTS

| | | | | |
|---|---|---|---|---|
| 5,841,190 A | * | 11/1998 | Noda | H01L 23/49575 257/E23.172 |
| 6,347,946 B1 | * | 2/2002 | Trobough | H05K 1/147 439/70 |
| 7,208,967 B2 | * | 4/2007 | Ho | G01R 31/2896 324/756.02 |
| 10,057,989 B1 | * | 8/2018 | Heikkinen | H05K 3/284 |
| 10,667,401 B2 | * | 5/2020 | Heikkinen | H05K 1/148 |
| 10,849,235 B1 | * | 11/2020 | Simula | H05K 5/065 |

(Continued)

FOREIGN PATENT DOCUMENTS

JP WO2013/132815 * 9/2013

*Primary Examiner* — Daniel St Cyr
(74) *Attorney, Agent, or Firm* — Robert P. Michal, Esq.; Carter, DeLuca & Farrell LLP

(57) ABSTRACT

The multilayer structure including a substrate film and a number of functional components and/or integrated circuits, including at least one first conductive element, at least one second conductive element, and at least one subsidiary conductive element, optionally traces, provided upon the substrate film. The substrate film has been provided with at least one coupling location enhancement element at a coupling location with respect to the substrate film, wherein at said coupling location the coupling location enhancement element is configured to provide an electrical connection between the first conductive element and second conductive element, further wherein said coupling location enhancement element is configured to inhibit coupling between the first conductive element and the subsidiary conductive element at the coupling location and between the second conductive element and the subsidiary conductive element at the coupling location.

20 Claims, 6 Drawing Sheets

(56) References Cited

U.S. PATENT DOCUMENTS

| | | | |
|---|---|---|---|
| 2007/0169879 A1* | 7/2007 | Hakansson | H05K 3/284 156/252 |
| 2008/0296047 A1* | 12/2008 | Kaji | H05K 1/0271 29/832 |
| 2010/0002398 A1* | 1/2010 | Braunisch | H01L 25/0657 361/764 |
| 2012/0106095 A1* | 5/2012 | Daniel | H05K 1/0283 361/728 |

\* cited by examiner

3A

3B

3C

6A

6B

MULTILAYER STRUCTURE AND METHOD OF MANUFACTURING SUCH

FIELD OF THE INVENTION

The present invention relates in general to functional, integrated structures incorporating functional features such as electronic elements. In particular, the present invention relates to a structure comprising a substrate film and conductive elements, wherein at least one coupling location enhancement element is arranged at a coupling location of the substrate film.

BACKGROUND

In the field of electronics and electronic products, different types of stacked or multilayer structures are known to be provided for a variety of diverse applications.

Many implementations involve provision of elements, specifically electronic or otherwise functional elements, on a substrate, such that at least a portion of the elements are electrically coupled. The positioning of such elements may be relevant for functioning of the structure and/or relating to other aspects of the structure, such as dimensions of the structure, which may be determined by the use case or environment, or which may generally be for instance optimized, e.g. in view of overall size of the structure.

Yet, in the context of electrical elements and electrical coupling, relative positioning of electrically conductive elements may be highly critical to ensure coupling between elements that should be coupled for obtaining a functioning structure, while avoiding electrical coupling of other conductive elements to ensure that e.g. undesired short circuiting is prevented.

In a more general sense, the integration of different functionalities involving e.g. electronics, mechanical or optical features in connection with a structure may provide motivation for specific multilayer approaches applied to different use case scenarios. The backdrop may involve size savings, weight savings, cost savings, or efficient integration of components, whereby these criteria may be needed to take into account in the structure and its design, while still complying with the necessary conditions relating to e.g. an electrical circuit that is to be provided. Associated use scenarios may relate to product packages or casings, visual design of device housings, wearable electronics, personal electronic devices, displays, detectors or sensors, vehicle interiors, antennae, labels, vehicle electronics, to name a few examples.

Electronics such as electronic components, ICs (integrated circuit), and conductors, may be generally provided onto a substrate through a plurality of different techniques. For example, ready-made electronics such as various surface mount devices (SMD) may be mounted on a substrate surface that ultimately forms an inner or outer interface layer of a multilayer structure. Additionally, technologies falling under the term "printed electronics" may be applied to actually produce electronics directly and additively to the associated substrate. The term "printed" refers in this context to various printing techniques capable of producing electronics/electrical elements from the printed matter, including but not limited to screen printing, flexography, and inkjet printing, through a substantially additive printing process.

Furthermore, the concept of injection molded structural electronics (IMSE) involves building functional devices or portions of such devices in the form of a multilayer structure, which encapsulates electronic functionality as seamlessly as possible. Characteristic to IMSE is also that the electronics is commonly manufactured into a true three-dimensional (3D) (non-planar) form in accordance with 3D models of the overall target product, part or generally design. To achieve desired 3D layout of electronics on a 3D substrate and in the associated end product, the electronics may be still provided on an initially planar substrate, such as a film, using two dimensional (2D) methods of electronics assembly, whereupon the substrate, already accommodating the electronics, may be formed into a desired three-dimensional, i.e. 3D, shape and subjected to overmolding, for example, by suitable plastic material that covers and embeds the underlying elements such as electronics, thus protecting and potentially hiding the elements from the environment. Further layers and elements may be naturally added to the construction.

When mounting elements such as mechanical, optical or electrical components onto e.g. a film-type substrate, such as a thermoplastic film, the substrate or surrounding other layers at least indirectly connected to the elements may be later subjected to forces involving e.g. twisting, stretching, compression or bending, which may cause the elements to break or detach from the substrate.

Generally, when elements such as conductor traces are positioned near a location of a hosting substrate film that is subjected to substantial deformation, the elements may tear and fail. For example, conductive ink used in crossover structures may be more brittle than standard conductive ink, which increases the risk of failure in the vicinity of e.g. insulator boundary and considerable curvature of the substrate.

SUMMARY

The objective of the present invention is to at least alleviate one or more of the drawbacks associated with the known solutions in the context of multilayer structures where conductive elements are provided, where there is considered to be a coupling location with respect to a substrate and conductive elements, where electrical coupling between at least two conductive elements or portions thereof is to be inhibited, while electrical coupling between some elements or portions thereof is to be enabled. The term "element" may refer to an entire entity or body or it may refer to a portion of an entity. In particular, for example yet not necessarily, a "first conductive element" may refer to a first portion of an electrical component or conductor, while a "second conductive element" may refer to a second portion of an electrical component or conductor. An element may also refer to a body or entity having further portions. For instance, a subsidiary conductive element may comprise at least a first portion and second portion.

The objective is achieved with various embodiments of a multilayer structure and related methods for providing a multilayer structure.

According to a first aspect, a multilayer structure is provided. The multilayer structure comprises a substrate film and a number of functional, preferably including optical, mechanical, optoelectrical, electrical and/or specifically, electronic, elements, such as conductors, insulators, components and/or integrated circuits. The functional elements comprise at least one first conductive element, at least one second conductive element, and at least one subsidiary conductive element, optionally traces/conductors, provided upon the substrate film. The substrate film has additionally been provided with at least one coupling location enhancement element at a coupling location with respect to the substrate film. At said coupling location, the coupling location enhancement element is configured to provide an electrical connection between the first conductive element and second conductive element optionally residing on opposing sides of the subsidiary conductive element on the substrate film. The coupling location enhancement element is additionally configured to inhibit coupling between the first conductive element and the subsidiary conductive element at the coupling location and between the second conductive element and the subsidiary conductive element at the coupling location.

The term "coupling location" may refer to a location e.g. on a substrate at which the coupling location enhancement element is provided or to a space that is occupied or to be occupied by the coupling location enhancement element. Additionally or alternatively, the term "coupling location" may refer to a location where a first conductive element or extension thereof may contact the subsidiary conductive element or extension thereof in the absence of the coupling location enhancement element and/or a location where a second conductive element or extension thereof may contact the subsidiary conductive element or extension thereof in the absence of the coupling location enhancement element. The coupling location may be determined by the orientation of the first, second, and subsidiary conductive elements.

With the present invention, a multilayer structure may be provided with selected functionality in terms of electrical features, where the structure may also satisfy other possible criteria in terms of e.g. shape or dimensions of the structure or any of its associated components or portions thereof, such as the substrate film or overall of the structure, while ensuring the feasibility of the selected functionality.

With a coupling location enhancement element as claimed, a multilayer structure may be manufactured and provided with couplings or crossovers being realized without through-holes in the substrate.

The present invention also provides a clever way of providing an interchange/junction station for functional elements such as electrical conductor traces, where a mutual configuration or topography of the e.g. traces may be altered.

In the context of printed electronics, a structure for inhibiting coupling between two or more conductive elements such as traces to provide a crossover element could be realized through dielectric stacks with several printed layers. However, such structures may be fragile in use or during manufacturing of a multilayer structure. For instance, if a manufacturing process involves injection molding, the printed stacks may be prone to flushing out or being displaced. If thermoforming is utilized, the structure may fail if it is in the vicinity of an elongation area on the substrate. Also, the applications of such printed stacks may be limited, as it may be difficult to produce dielectric stacks that can withstand high humidity, temperature and/or bias voltage. Poor withstanding of high humidity, temperature and/or bias voltage may be due to air bubbles that can be trapped inside the stack during printing phases. The poor withstanding may also be caused by silver flakes penetrating through the dielectric layers. These issues may cause the dielectric stack to electrically leak. Embodiments of the present invention provide coupling location enhancement elements that may provide multiple functionalities in addition to inhibiting coupling between conductive elements.

In an embodiment, the substrate film may comprise formable material. The formable material may be thermoformable, optionally polymer, PMMA (Polymethyl methacrylate), Poly Carbonate (PC), copolyester, copolyester resin, polyimide, a copolymer of Methyl Methacrylate and Styrene (MS resin), glass, and/or Polyethylene Terephthalate (PET).

In an embodiment, the substrate film may comprise a selected three-dimensional, optimally thermoformed, non-flat shape.

In cases where the substrate film is provided with the functional elements, including the conductive elements prior to forming to a three-dimensional shape, the coupling location enhancement element may be especially advantageous as it may be difficult to fine-tune the final locations of the elements with respect to each other on the substrate film. The functionality of the structure in terms of electrical connections that are to be either made or avoided may be efficiently realized and retained.

Yet relating to formable or formed substrates, the substrate material and/or a three-dimensional form of the substrate may lead to a structure where through-holes would be difficult to realize. The present invention may eliminate this problem, as a coupling or crossover situation relating to conductive elements may be handled without through-holes with the coupling location enhancement element(s).

In some embodiments, the coupling location enhancement element may be configured to control the deformation of the substrate within a proximity of a three-dimensional shape into which the substrate is formed, optionally comprising the control over the distribution of deforming forces in selected directions. The integrity of the substrate may then advantageously be maintained.

The coupling location enhancement element may also aid in maintaining integrity of at least one of the functional elements involved in the multilayer structure, such as one of the first conductive element, second conductive element, or subsidiary conductive element.

The coupling location enhancement element may in some embodiments be or comprise at least one of the functional elements. The coupling location enhancement element may comprise a resistor, a ferrite bead, a light-emitting element or light source such as light-emitting diode (LED), or a capacitor, for example.

A structure may comprise a plurality of coupling location enhancement elements. In some embodiments, at least two coupling location enhancement elements may provide a collective activity. For instance, at least two coupling location enhancement elements may provide a collective activity relating to sensing applications.

In one embodiment, the coupling location enhancement element may comprise thermoplastic material. A coupling location enhancement element may advantageously comprise thermoformable material.

In embodiments of the invention, the coupling location enhancement element may comprise a multilayer substructure. Such a substructure may comprise at least one conductive layer and at least one insulating layer. The layers of the multilayer substructure of the coupling location enhancement element may be disposed essentially codirectionally with the substrate film at the coupling location. Such layers need not be codirectional, but the multilayer substructure may essentially have its respective layers arranged such that the stack is formed generally in the same direction as the stack formed by the multilayer structure itself.

A multilayer substructure may comprise castellations preferably comprising conductive material at one or more edges of the multilayer substructure.

A coupling location enhancement element comprising a multilayer substructure may comprise at least one insulating layer disposed between outer conductive layers.

Outer conductive layers may define at least one top extension element and at least one bottom extension element, wherein the top extension element is configured to extend between the first conductive element and second conductive element to provide the electrical connection between the first conductive element and second conductive element. The subsidiary conductive element may comprise a first portion and a second portion, wherein the bottom extension element is configured to provide an electrical connection between the first portion and second portion.

In some embodiments, at least an insulating layer of a multilayer substructure may comprise thermoplastic material, preferably thermoformable material. The material may be the same or similar material that is used for forming the substrate film.

In a further embodiment, at least an insulating layer of a multilayer substructure may comprise or essentially consist of adhesive material. Conductive layers may optionally also comprise or essentially consist of adhesive material.

In one embodiment, the coupling location enhancement element may be shaped to provide a gap between the substrate film and the coupling location enhancement element at the coupling location.

The coupling location enhancement element may be provided in connection with a cohesion maintaining element, the cohesion maintaining element comprising an adhesive material and preferably being provided to contact the coupling location enhancement element, the substrate film, and the subsidiary conductive element. In some embodiments, the cohesion maintaining element may be adapted to extend along the substrate film beyond borders of the coupling location enhancement element and/or the subsidiary conductive element. A cohesion maintaining element may be configured to secure the coupling location enhancement element, first conductive element, second conductive element and/or subsidiary conductive element to each other and/or to the substrate film.

The coupling location enhancement element may comprise at least one passive SMD component.

A coupling location enhancement element may in some embodiments additionally be configured to provide a transformation of topography, such that a topography of at least one of the first conductive element, second conductive element and subsidiary conductive element is altered from a first topography to a second topography at the coupling location. A coupling location enhancement element may thus function as a junction station where a mutual configuration of the traces may be altered.

According to an aspect, a method for producing a multilayer structure is provided, the method comprising:
obtaining a substrate film;
providing a number of functional elements on the substrate film, wherein the functional elements comprise at least one first conductive element, at least one second conductive element, and at least one subsidiary conductive element; and
wherein the substrate film is further provided with a coupling location enhancement element at a coupling location with respect to the substrate film, said coupling location enhancement element being configured to provide an electrical connection between the first conductive element and second conductive element, further wherein said coupling location enhancement element is configured to inhibit coupling between the first conductive element and the subsidiary conductive element at the coupling location and between the second conductive element and the subsidiary conductive element at the coupling location.

The exemplary embodiments of the present invention presented herein are not to be interpreted to pose limitations to the applicability of the appended claims. The verb "to comprise" is used herein as an open limitation that does not exclude the existence of also un-recited features. The features recited in various embodiments and e.g. dependent claims are mutually freely combinable unless otherwise explicitly stated.

The novel features which are considered as characteristic of the present invention are set forth in particular in the appended claims. The present invention itself, however, both as to its construction and its method of operation, together with additional objectives and advantages thereof, will be best understood from the following description of specific embodiments when read in connection with the accompanying drawings.

BRIEF DESCRIPTION OF FIGURES

Some embodiments of the invention are illustrated by way of example in the figures of the accompanying drawings.

DETAILED DESCRIPTION OF SOME EMBODIMENTS

Figure 1:
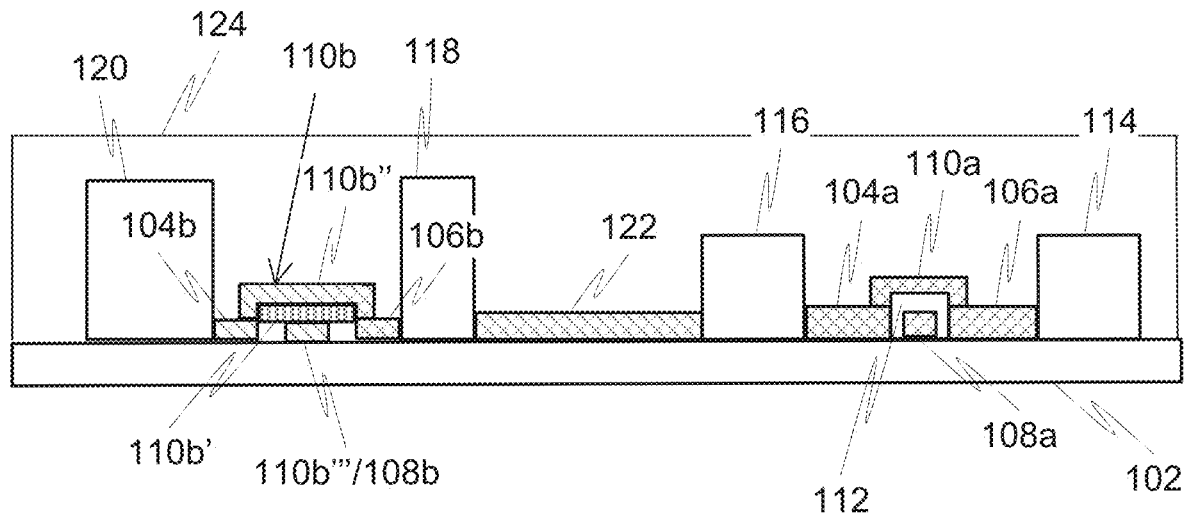
FIG. 1 illustrates an embodiment of a multilayer structure in accordance with the present invention.

FIG. 1 illustrates a cross-sectional view of an embodiment of a multilayer structure 100, such as of an integrated functional multilayer structure 100, in accordance with the present invention. The structure 100 may itself establish an end product such as an electrical or electronic device or be connected to or installed at such after manufacturing, for example.

The multilayer structure 100 comprises a substrate film 102. The substrate film 102 may be a flexible substrate film, which may comprise formable material. The substrate film 102 may be formed or formable so as to exhibit a selected non-flat shape, for example, a 3D shape such as a bend, recess, protrusion, etc. The substrate 102 of FIG. 1 is shown as flat as an example.

The structure 100 may further comprise a number of functional elements. The functional elements may comprise optical, mechanical, optoelectrical, electrical and/or electronic elements. The functional elements comprise at least a first conductive element 104a, a second conductive element 106a, and subsidiary conductive element 108a. The first conductive element 104a and second conductive element 106a may reside at least partially on opposing sides of the subsidiary conductive element 108a on the substrate film 102. The structure 100 additionally comprises at least one coupling location enhancement element 110a at a coupling location with respect to the substrate film 102.

At the coupling location, the coupling location enhancement element 110a is configured to provide an electrical connection between the first conductive element 104a and second conductive element 108a, while inhibiting coupling between the first conductive element 104a and the subsidiary conductive element 108a at the coupling location and between the second conductive element 106a and the subsidiary conductive element 108a at the coupling location. Inhibiting of coupling may preferably mean that an electrical connection is prevented.

The coupling location may generally refer to a location with respect to the substrate film 102 at which the coupling location enhancement element 110a is provided. The coupling location may refer to a location with respect to the substrate 102 where the electrical connection between the first conductive element 104a and second conductive element 108a is provided via the coupling location enhancement element 110a and/or a location with respect to the substrate film 102 where coupling or electrical connection between the first conductive element 104a and the subsidiary conductive element 108a and between the second conductive element 106a and the subsidiary conductive element 108a is inhibited.

The electrical connection or coupling being provided at the coupling location may refer to coupling being enabled through an extension element of a coupling location enhancement element as will be demonstrated in further embodiments.

The electrical connection or coupling being inhibited at the coupling location may refer to the coupling location enhancement element preventing electrical connection between selected conductive elements or extensions thereof, which would be provided in the absence of the coupling location enhancement element.

Conductive elements that are electrically coupled, at least after provision of the coupling location enhancement element, such as a first conductive element 104 and second conductive element 106 may also be considered as conjoined and forming one entity, e.g. conductive trace.

A gap 112 may also be provided between the coupling location enhancement element 110a and the substrate film 102.

The first conductive element 104a, a second conductive element 106a, and subsidiary conductive element 108a may be conductors or portions thereof.

The multilayer structure 100 and all of its constituents shown in the figures are merely exemplary considering e.g. their size.

The structure 100 may additionally comprise further functional elements, which may comprise one or more further first conductive elements 104b, further second conductive element 106b, and further subsidiary conductive element 108b. The (further) first conductive element 104b and (further) second conductive element 106b may be considered as being provided on the substrate at least partially on opposing sides of the (further) subsidiary conductive element 108b. The subsidiary conductive element 108b may be provided as one monolithic body or it may be provided as portions comprising at least a first portion and second portion (not shown in FIG. 1), which may be considered as comprising or forming a mutual longitudinal axis, on opposing sides of which the first conductive element 104 and second conductive element may (at least partially be provided).

During manufacturing of a multilayer structure 100, conductive elements may be provided on the substrate 102 as separate portions or components, while a fully formed multilayer structure may be considered as comprising or forming, at least in the vicinity of the coupling location enhancement element 110, two conductive structures such as conductors (possibly formed from separate portions) that cross each other as viewed from a direction normal to the substrate film, such that at the coupling location, the crossing elements are inhibited from forming an electrical connection.

The structure may comprise at least one further coupling location enhancement element 110b. A (further) coupling location enhancement element may comprise a multilayer substructure, and therefore a coupling location enhancement element may refer to or comprise either a single component or body or a group of constituent bodies jointly establishing the coupling location enhancement element. A multilayer substructure may comprise at least one conductive layer and at least one insulating layer.

A (further) coupling location enhancement element 110b may comprise at least one insulating layer 110b' disposed between conductive layers 110b'' and 110b''' (which may be considered as outer conductive layers, i.e. constituting the outermost layers of the multilayer substructure). A layer of a (sub)structure, such as a conductive layer 110b'' or 110b''' may comprise one or more separate components which make up a layer of the structure, where the components reside generally substantially on a plane that constates a layer of the structure. Thus, a layer does not necessarily have to be monolithic, although it may be.

The outer conductive layers 110b'' and 110b''' may define at least one top extension element and at least one bottom extension element, such that the top extension element is configured to extend between the first conductive element 104b and second conductive element 106b to provide the electrical connection between the first conductive element and second conductive element. Here, it may be considered that the subsidiary conductive element 108b comprises a first portion and a second portion, and the bottom extension element is configured to provide an electrical connection between the first portion and second portion, and thereby the bottom extension element, first portion, and second portion may also be considered to form the subsidiary conductive element 108b. In FIG. 1, a bottom conductive layer 110b''' (or at least the extension element, which will be described in more detail further below) may thus also be considered to form part of the subsidiary conductive element 108b.

The structure 100 may additionally comprise any number of yet further functional elements 114, 116, 118, 120, 122 such as further conductors, insulators, components such as LEDs, and/or integrated circuits, for instance, provided upon the substrate film 102.

In various additional or supplementary embodiments, at least some of the number of functional elements, such as of conductors and/or connection/contact elements, such as pads, comprise at least one material selected from the group consisting of: conductive ink, conductive nanoparticle ink, copper, steel, iron, tin, aluminum, silver, gold, platinum, conductive adhesive, carbon fiber, alloy, silver alloy, zinc, brass, titanium, solder, and any component thereof. The used conductive materials may be optically opaque, translucent and/or transparent at desired wavelengths, such as visible light, so as to mask or let the radiation such as visible light to be reflected therefrom, absorbed therein or let through, for instance.

In various embodiments, such as shown in FIG. 1, the multilayer structure 100 may further comprise a plastic, optionally thermoplastic, layer 124 produced, optionally molded, such as injection molded, or cast, upon the substrate film 102 and embedding at least portion of the number of functional elements 104a, 104b, 106a, 106b, 108a, 108b, 114, 116, 118, 120, 122 and/or of coupling location enhancement element 110a, 110b therewithin.

In some embodiments (not shown in FIG. 1), the multilayer structure 100 may comprise a second substrate, such as a second substrate film, arranged at the opposite side of the plastic layer 124 relative to the substrate film 102. In such embodiments, the plastic layer 124 may be produced, optionally molded, such as injection molded, or cast, between the substrate film 102 and the second substrate, and embedding at least portion of the number of functional elements 104a, 104b, 106a, 106b, 108a, 108b, 114, 116, 118, 120, 122 and/or of coupling location enhancement element 110a, 110b therewithin.

The substrate film 102 may comprise a 3D, optionally thermoformed or otherwise non-flat shape. The shape induced may be essentially permanent (molded, drilled, cut or e.g. thermoformed shape) or temporary (remain while an external force is subjected to the structure 100 or element such as the film 102 thereof, for example).

The coupling location enhancement element 110a, 110b may be configured to control the deformation of the substrate film 102. The control may comprise the control over the distribution of deforming forces in selected directions, for example, substantially at a position or transition area of any non-flat shape formed on the substrate film 102.

The substrate film 102 (and any optional second substrate film) utilized may refer to a rigid or flexible (and bendable) substrate film in which one (e.g. z, such as "thickness") of the three dimensions is significantly shorter with respect to the other two (e.g. x and y) dimensions, for example. Thus, the substrate film 102, may, at least originally, be an essentially planar substrate. However, the substrate film 102 may, either originally or after processing such as 3D-forming (e.g. thermoforming) generally or locally define 3D shape(s), such as a curved or bent shape(s).

The thickness of the substrate film 102 may vary depending on the embodiment; it may only be of few tens or hundredths of a millimeter, or considerably thicker, in the magnitude of one or few millimeter(s), for example.

The substrate film 102 may comprise at least one material selected from the group consisting of: polymer, thermoplastic material, electrically insulating material, PMMA (Polymethyl methacrylate), Poly Carbonate (PC), copolyester, copolyester resin, polyimide, a copolymer of Methyl Methacrylate and Styrene (MS resin), glass, Polyethylene Terephthalate (PET), carbon fiber, organic material, biomaterial, leather, wood, textile, fabric, metal, organic natural material, solid wood, veneer, plywood, bark, tree bark, birch bark, cork, natural leather, natural textile or fabric material, naturally grown material, cotton, wool, linen, silk, and any combination of the above. If there is the second substrate, it may differ from the first substrate film 102 in terms of dimensions, shapes, and/or material(s).

The plastic layer 124 may comprise thermoplastic and/or thermosetting material(s). Thickness of the molded or otherwise produced layer(s) may vary depending on the embodiment, being e.g. less than one, one, few or tens of millimeters. The material(s) may be e.g. electrically insulating. The layer 124 may comprise at least one material selected from the group consisting of: elastomeric resin, thermoset material, thermoplastic material, PC, PMMA, ABS, PET, copolyester, copolyester resin, nylon (PA, polyamide), PP (polypropylene), TPU (thermoplastic polyurethane), polystyrene (GPPS), TPSiV (thermoplastic silicone vulcanizate), and MS resin.

Figure 2:
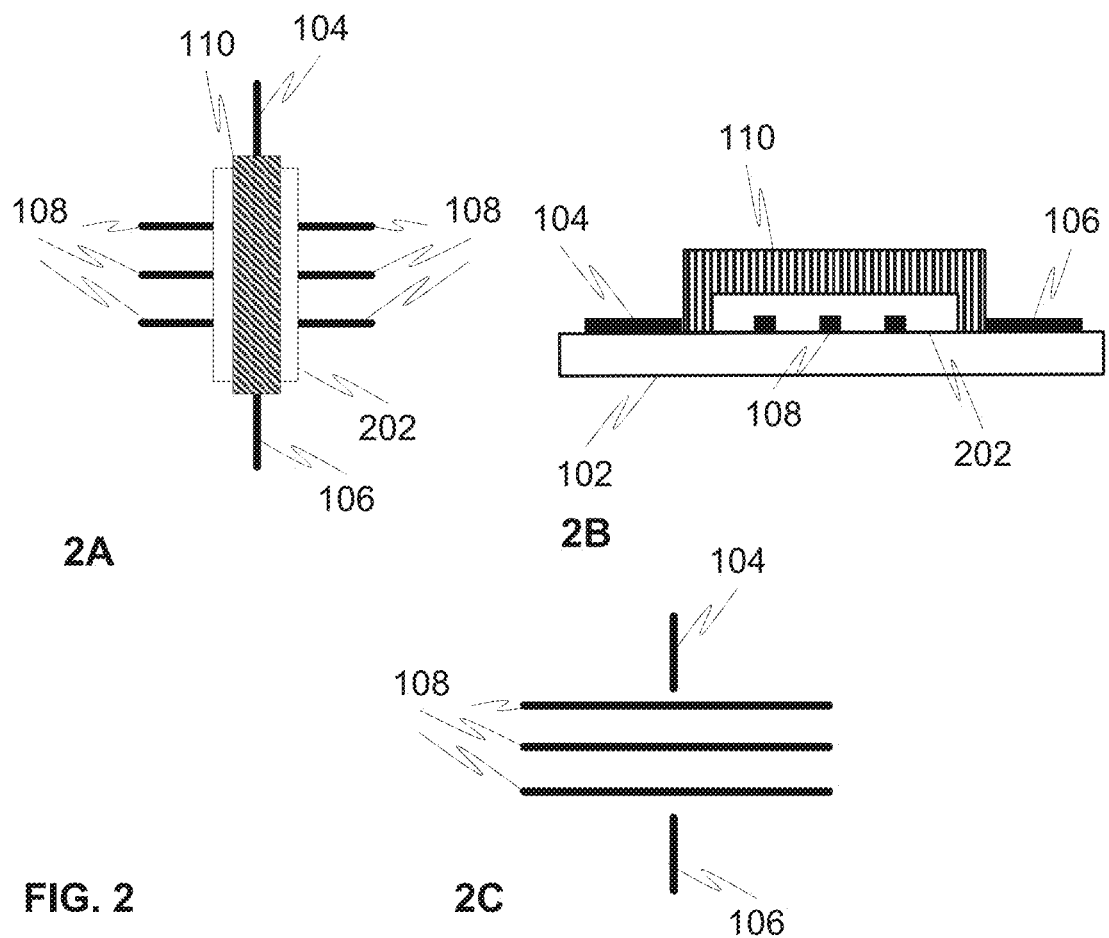
FIG. 2 illustrates an embodiment of at least a portion of a multilayer structure comprising a coupling location enhancement element in accordance with the present invention.

FIG. 2 shows at 2A one embodiment of at least a portion of a multilayer structure 100 showing a coupling location enhancement element 110 and functional elements shown as viewed from a direction normal to the substrate film 102 (not depicted in FIG. 2A), while FIG. 2B shows a cross-sectional view of a multilayer structure 100 essentially corresponding to that of FIG. 2A.

In this embodiment, the coupling location enhancement element 110 may mostly consist of conductive material or at least comprise a portion of conductive material that connects the first conductive element 104 and second conductive element 106.

The dimensions of the coupling location enhancement element 110 may be selected based on the use case. In some embodiments, a ready-made electrical component such as resistor, capacitor, or jumper may be utilized. A coupling location enhancement element 110 may be selected to exhibit a selected shape for example taking into account one or more of the first conductive element 104, second conductive element 106, or subsidiary conductive element 108 in terms of size, number, and/or mutual locations.

For instance, as seen in FIG. 2, the structure 100 may comprise a plurality of subsidiary conductive elements 108. The coupling location enhancement element 110 may be configured to inhibit coupling between the first conductive element 104 and each of the subsidiary conductive elements 108 at at least the coupling location and inhibit coupling between the second conductive element 106 and each of the subsidiary conductive elements 108. A structure 100 may also comprise a plurality of first conductive elements 104 and a plurality of second conductive elements 106 as will also be seen later herein.

The multilayer structure 100 may additionally comprise a cohesion maintaining element 202, which may be provided in connection with the coupling location enhancement element 110. The cohesion maintaining element 202 may comprise an adhesive material, such as structural adhesive, and may be provided to contact at least the coupling location enhancement element 110, the substrate film 102, and the subsidiary conductive element 108.

The cohesion maintaining element 202 may be adapted to extend along the substrate film 102 beyond borders of the coupling location enhancement element 110 as seen in FIG. 2A. The cohesion maintaining element 202 may also extend along the substrate film 102 beyond borders of the subsidiary conductive element(s) 108.

A cohesion maintaining element 202 may be configured to secure the coupling location enhancement element 110, first conductive element 104, second conductive element 106 and/or subsidiary conductive element 108 to each other and/or to the substrate film 102.

The cohesion maintaining element 202 may additionally or alternatively be configured to provide protection or support for the first conductive element 104, second conductive element 106 and/or subsidiary conductive element 108. For instance, the cohesion maintaining element 202 may, as it may extend beyond borders of the coupling location enhancement element 110 and/or beyond borders of the subsidiary conductive element(s) 108, protect the subsidiary conductive element(s) 108 from e.g. cracking during forming of the substrate 102 and/or during use of the structure 100.

In some embodiments, a cohesion maintaining element 202 may be configured to control the deformation of the substrate film 102 in addition to or alternatively to the coupling location enhancement element 110 doing so.

The embodiment of FIG. 2 may be realized also without the cohesion maintaining element 202.

The coupling location enhancement element 110 may comprise or be a jumper, SMD, or the coupling location enhancement element 110 may be at least a portion of an integrated circuit.

FIG. 2C illustrates an example of how first conductive element 104, second conductive element 106, and subsidiary conductive elements 108 may be provided on a substrate film 102 e.g. before provision of a coupling location enhancement element 110 corresponding to FIGS. 2A and 2B.

In some embodiments of the invention, the first conductive element and/or the second conductive element may be realized as part of the coupling location enhancement element 110 or may be considered to form a part of the coupling location enhancement element 110. This is illustrated in connection with FIG. 3.

Figure 3:
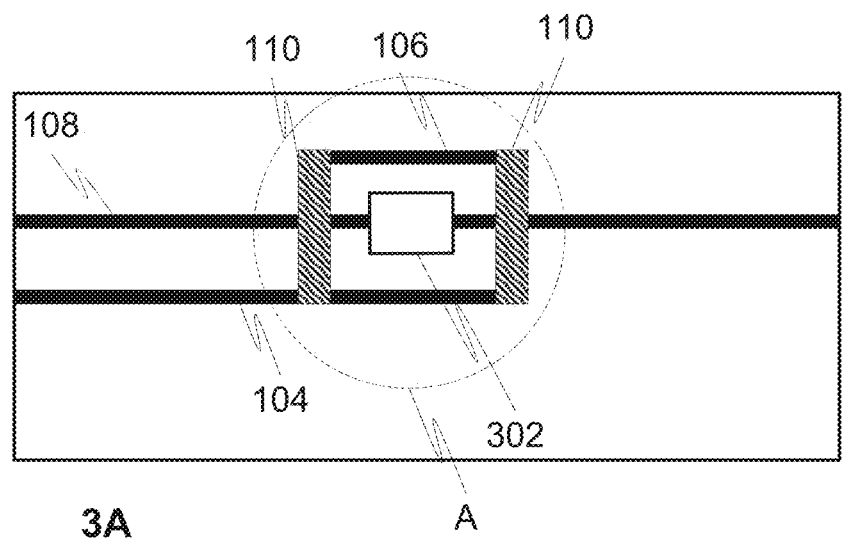
FIG. 3 shows one embodiment of a multilayer structure in accordance with the present invention.
Figure 3:
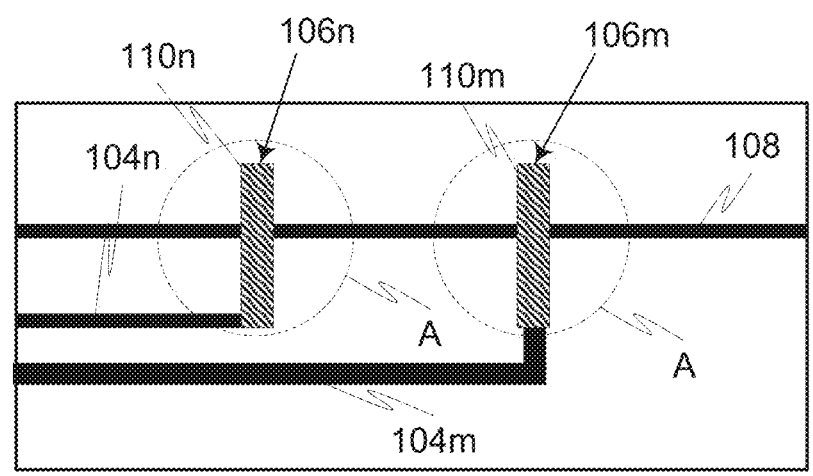
Figure 3:
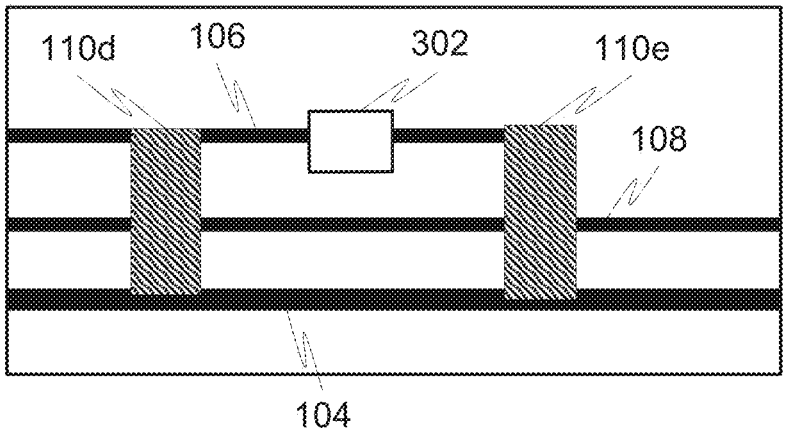

FIG. 3 shows at 3A, 3B, and 3C embodiments of a multilayer structure 100 comprising a plurality of coupling location enhancement elements 110 that may provide a collective effect. In the embodiments of FIG. 3, the collective effect is related to a sensing application.

Coupling location enhancement elements 110 corresponding to those depicted in FIG. 3 may also be provided in isolation, i.e. in connection with multilayer structures 100 comprising only one coupling location enhancement element 110. A sensing application may be provided using multilayer structures 100 comprising one coupling location enhancement element 110.

Yet, FIGS. 3A and 3B show multilayer structures 100 (or portions of multilayer structures 100) each comprising two coupling location enhancement elements 110. In these embodiments, a coupling location enhancement element 100 may comprise e.g. a jumper or other conductive body shaped to form a gap 112 between the coupling location enhancement element 100 and the substrate 102.

Referring to FIG. 3A, the structure comprises a first conductive element 104, a second conductive element 106, a subsidiary conductive element 108, and coupling location enhancement elements 110. In this self-capacitive mode embodiment employing an LED 302, the first conductive element 104 such as trace line may form a touch electrode, while the subsidiary conductive element 108 such as trace line forms a connection to LED 302. The subsidiary conductive element 108 may be a continuous elongated body along the substrate surface. The second conductive element 106 may serve as a connector between the two coupling location enhancement elements 110.

The coupling location enhancement elements 110 are configured to provide electrical connections between the first conductive element 104 and second conductive element 106, which may reside on opposing sides of the subsidiary conductive element 108 on the substrate film 102, and to inhibit coupling between the first conductive element 104 and the subsidiary conductive element 108 at the coupling location and between the second conductive element 106 and the subsidiary conductive element 108 at the coupling location. An area A schematically depicts an effective touch button area on the structure.

FIG. 3B exhibits a mutual capacitance mode embodiment, where each of the two coupling location enhancement elements 110 is associated with a respective first conductive element 104. A first receiving touch electrode 104n and second receiving touch electrode 104m may be provided, each coupled to a respective coupling location enhancement element 110n and 110m.

Second conductive elements 106n, 106m may be separate elements provided at the substrate surface, such as conductors connecting the coupling location enhancement element(s) 110n and/or 110m to the substrate surface.

Second conductive elements 106n, 106m may alternatively be provided in connection with the coupling location enhancement element(s) 110n and/or 110m. A second conductive element 106n, 106m may be considered as a portion of a body of a coupling location enhancement element 110n 110m that comprises conductive material and is coupled to the substrate surface. Second conductive elements 106n, 106m may provide an electrode functionality.

A subsidiary conductive element 108 (which may be a continuous elongated body along the substrate surface) may form a transmitting touch electrode. Areas A illustrate effective touch button areas on the structure.

The coupling location enhancement elements 110n, 110m are thus configured to provide electrical connections between the first conductive elements 104n 104m and second conductive elements 106n, 106m residing on opposing sides of the subsidiary conductive element 108 on the substrate film, and to inhibit coupling between the first conductive elements 104n, 104m and the subsidiary conductive element 108 at the coupling location and between the second conductive elements 106n, 106m and the subsidiary conductive element 108 at the coupling location.

FIG. 3C shows one more embodiment where a plurality of coupling location enhancement elements provide a collective, here sensing, function. A first conductive element 104 may form a ground electrode, a second conductive element 106 may form a trace line connecting an LED 302 and both coupling location enhancement elements 110d, 110e, and a subsidiary conductive element 108 may form a touch electrode.

A first coupling location enhancement element 110d may comprise a capacitor to filter signals and electromagnetic interference, while a second coupling location enhancement element 110e may comprise a zero-ohm resistor for connecting to the ground planes. Ferrite beads may additionally or alternatively be used as coupling location enhancement elements 110 to reduce electromagnetic interference in transmission lines.

Figure 4:
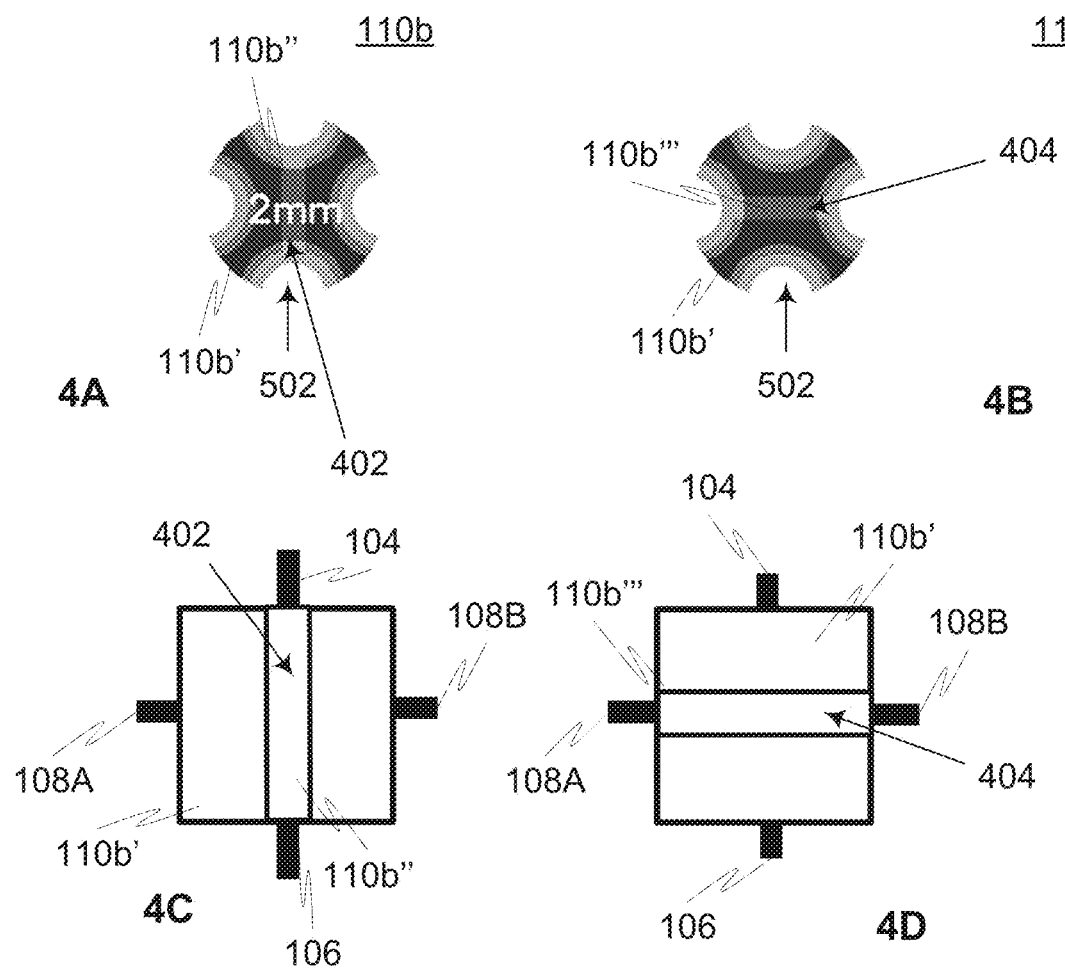
FIG. 4 shows exemplary coupling location enhancement elements according to embodiments of the invention.
Figure 5:
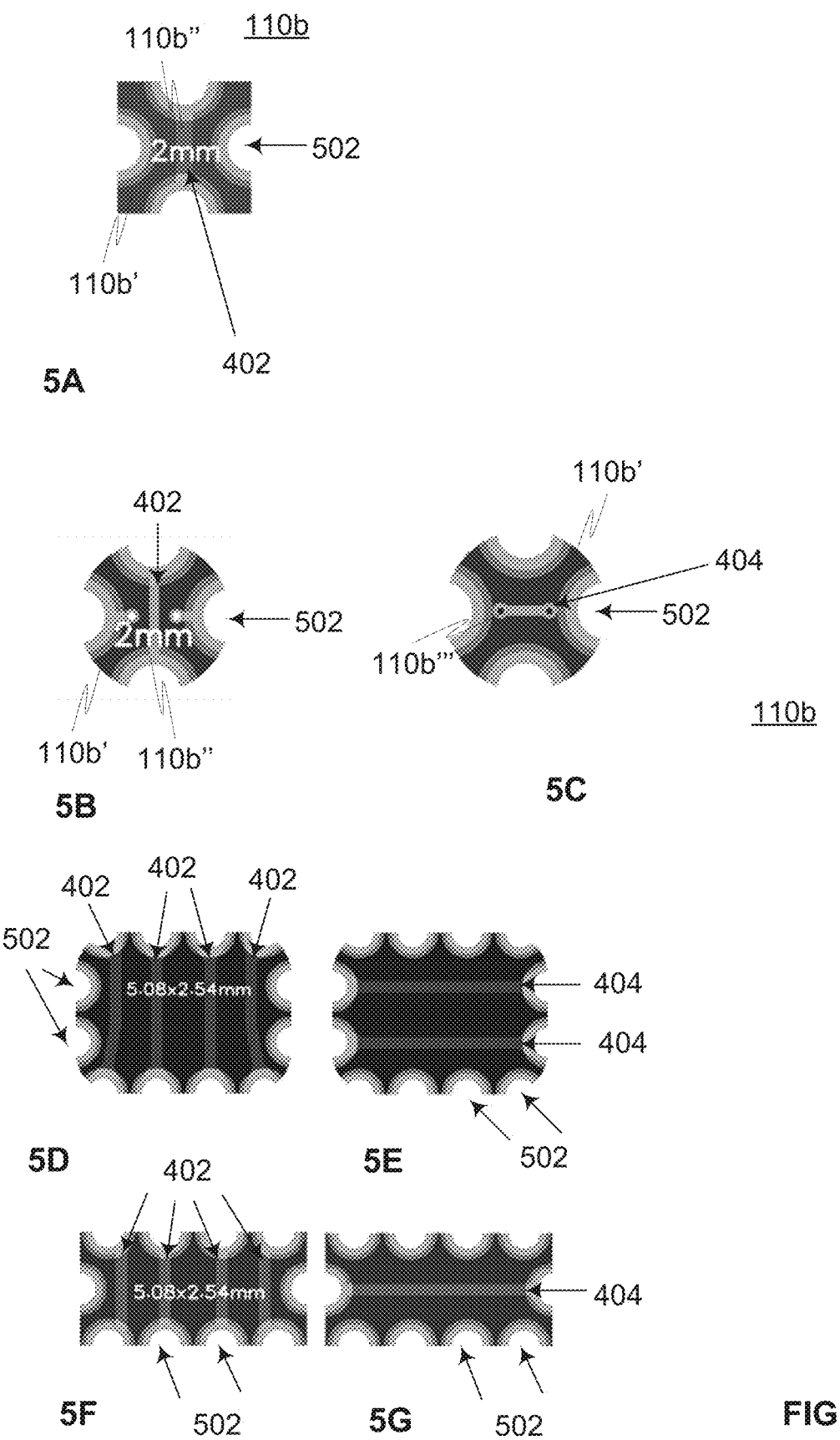
FIG. 5 exhibits exemplary coupling location enhancement elements according to embodiments of the invention.

FIGS. 4-5 illustrate different embodiments of coupling location enhancement elements where the coupling location enhancement elements 110b comprise a multilayer substructure comprising at least one insulating layer 110b' disposed between conductive layers 110b" and 110b'". In these embodiments, it may be considered that the coupling location enhancement element 110b is provided as a small printed circuit board (PCB) module.

FIG. 4A shows a top view of a coupling location enhancement element 110b and FIG. 4B shows a bottom view of a coupling location enhancement element 110b. A layer may comprise one component or two or more separate components forming the layer.

As an example, and depicted in FIG. 4A, a diameter of the coupling location enhancement element 110b may e.g. be about 2 mm.

The top conductive layer 110b" may define at least one top extension element 402, configured to extend between the first conductive element 104 and second conductive element 106 to provide the electrical connection between the first conductive element 104 and second conductive element 106.

The bottom conductive layer 110b'" may define at least one bottom extension element 404 configured to provide an electrical connection between a first portion and a second portion of a subsidiary conductive element 108.

In one method of manufacturing a multilayer structure 100, a coupling location enhancement element 110b may be produced as a multilayer substructure onto the substrate film 102, but it may also be separately manufactured prior to provision of the coupling location enhancement element 110b to the coupling location. The manufacturing method of the coupling location enhancement element 110, 110b and whether produced onto the substrate 102 or as a separate component/element may depend on the materials used in the coupling location enhancement element 110, 110b, for instance. In particular, e.g. considering embodiments of FIGS. 4-5 and coupling location enhancement element 110b is provided as a small PCB modules, the coupling location enhancement element 110b may be formed e.g. from a separately manufactured printed PCB structure produced by standard methods.

After producing a coupling location enhancement element 110b, it may thereafter be adhered to the substrate film 102 e.g. using adhesive. Standard SMD methods may be applied.

Castellations 502 comprising conductive material are advantageously provided at edges of the coupling location enhancement element 110b, such that the castellations 502 are provided in connection with the top and bottom extension elements, to facilitate coupling of the first conductive element 104 to the top extension element 402, coupling of the second conductive element 106 to the top extension element 402, coupling of the first portion of the subsidiary conductive element 108 to the bottom extension element 406, and/or coupling of the second portion of the subsidiary conductive element 108 to the bottom extension element 404.

Castellated holes may be cut through the PCB by providing plated holes using conductive material before separating, e.g. cutting the separate PCB structure functioning as the coupling location enhancement element 110b from the panel.

FIG. 4C further illustrates a top view of a coupling location enhancement element 110b and first conductive element 104, second conductive element 106, first portion of subsidiary conductive element 108A, and second portion of subsidiary conductive element 108B, and FIG. 4D shows a bottom view of a coupling location enhancement element 110b and first conductive element 104, second conductive element 106, first portion of subsidiary conductive element 108A, and second portion of subsidiary conductive element 108B. FIG. 4 does not depict castellations which may, however, also be present.

FIG. 4C shows the top conductive layer 110b'' and underlying insulating layer 110b', where the top conductive layer 110b'' forms or defines a top extension element 402, configured to extend between the first conductive element 104 and second conductive element 106 to provide the electrical connection between the first conductive element 104 and second conductive element 106.

FIG. 4D shows bottom conductive layer 110b''' and insulating layer 110b' provided thereupon, where the bottom conductive layer 110b''' forms or defines a bottom extension element 404 configured to provide an electrical connection between a first portion of the subsidiary conductive element 108A and a second portion of the subsidiary conductive element 108B.

FIG. 4D shows schematically how the first portion 108A and second portion 108B of subsidiary conductive element 108 may be provided in connection with the bottom extension elements 404. It could also be considered that the first portion 108A, second portion 108B, and bottom extension element 4404 together form the subsidiary conductive element 108, at least after assembly of the multilayer structure 100.

The coupling location enhancement element 110b is configured to provide an electrical connection between the first conductive element 104 and second conductive element 106, which could be considered as residing on opposing sides of the subsidiary conductive element 108 on the substrate film, and to inhibit coupling between the first conductive element 104 and the subsidiary conductive element 108 at the coupling location and between the second conductive element 106 and the subsidiary conductive element 108 at the coupling location.

In the embodiment of FIG. 4, it may be considered that the first conductive element 104, second conductive element 106, and top extension element 402 form a top element such as trace and the subsidiary conductive element 108 (or its first portion and second portion, together with the bottom extension element 404) forms a bottom element such as trace, such that the top element and bottom element cross each other as viewed from a direction normal to the substrate surface (corresponding to the top and bottom views). The coupling location enhancement element 110 may thus be configured to provide a crossover element that enables a trace crossover while inhibiting short circuiting.

In one embodiment, the first conductive element 104, second conductive element 106, and subsidiary conductive element 108 may form different portions of the same entity. For example, the first conductive element 104, second conductive element 106, and subsidiary conductive element 108 may be different portions of an inductor.

FIG. 4E illustrates a configuration of first conductive element 104, second conductive element 106, first portion of subsidiary conductive element 108A, and second portion of subsidiary conductive element 108B that may be provided on a substrate film 102 prior to provision of the coupling location enhancement element 110b. The first conductive element 104, second conductive element 106, first portion of subsidiary conductive element 108A, and second portion of subsidiary conductive element 108B may be provided outside of the "coupling location" which is to be occupied by the coupling location enhancement element 110b, or they may overlap with the coupling location, such that the coupling location enhancement element 110b is provided on top of one or more of said conductive elements. After provision of the coupling location enhancement element 110b to the substrate film 102, it may be considered that the coupling location enhancement element 110b is configured to provide an electrical connection between the first conductive element and second conductive element and to inhibit coupling between the first conductive element and the subsidiary conductive element at the coupling location and between the second conductive element and the subsidiary conductive element at the coupling location.

FIG. 5 shows different embodiments of coupling location enhancement elements 110b comprising multilayer substructures with insulating layer 110b' disposed between conductive layers 110b'' and 110b'''. The layers form varying numbers of top extension elements 402 and bottom extension elements 404. Castellations 502 are also depicted. The castellations 502 may aid in providing connections between the conductive elements and extension elements. Conductive adhesive or SMD solder (paste) may further be used to provide an electrical connection from the first, second, and/or subsidiary conductive elements 104, 106, 108A, 108B to the coupling location enhancement element 110b.

A thickness of the coupling location enhancement element 110b may be e.g. between 0.01 mm and 1 mm, such as 0.2 mm or 0.4 mm. A thickness of 0.4 mm or over may be advantageous, as the coupling location enhancement element 110b may be pressed firmly in an assembly phase.

FIG. 5A shows a top view of a coupling location enhancement element 110b with sharp edges (or originally squared or rectangular form) that corresponds to that of FIGS. 4A and 4B (with rounded edges). A coupling location enhancement element 110b with sharp edges may be easier to manufacture than one with round edges. Yet, a coupling location enhancement element 110b with rounded edges may be more advantageous in applications where injection molding is employed to prevent displacement of the coupling location enhancement element 110b during manufacturing.

FIG. 5B shows a top view of a coupling location enhancement element 110b and FIG. 5C shows a bottom view of a coupling location enhancement element 110b. Here, a top extension element 402 is formed as described and depicted in the embodiments of FIGS. 4 and 5A, while a bottom extension element 404 is formed by using through holes or vias provided in the coupling location enhancement element 110b.

FIGS. 5D and 5F show top views of alternative coupling location enhancement elements 110b, with FIGS. 5E and 5G showing corresponding bottom views. Here, the coupling location enhancement elements 110b are configured to provide, separate extension elements (top extension elements 402 and bottom extension elements 404), for coupling to differing numbers of first, second, and/or subsidiary (or portions thereof) conductive elements 104, 106, and/or 108A, 108B. A size of 5.08 mm length and 2.54 mm height is given as exemplary.

Depicted figures show only one insulating layer 110b' disposed between two conductive layers 110b" and 110b'". Yet, depending on the embodiment, also further conductive and insulating layers may be provided. In different embodiments of the invention, a coupling location enhancement element 110 may facilitate provision of crossovers involving any number of first, second, and subsidiary conductive elements 104, 106, 108. Different layers and extension elements of the coupling location enhancement element 110 may host different conductive elements to provide complex crossover and/or junction stations. Topography of conductive elements may also be altered, as will be demonstrated further below.

The coupling location enhancement elements 110 according to embodiments of the invention, especially those comprising multilayer substructures, may provide low-profile (thin) components with surface areas being several magnitudes larger than their thickness, that may firmly be secured to the substrate 102.

A structural adhesive may in some embodiments advantageously not contact any printed trace lines on the substrate film 102.

Through embodiments of coupling location enhancement elements 110, high voltages and/or currents may be reliably enabled, while conductivity may be enhanced over printed lines.

Figure 6:
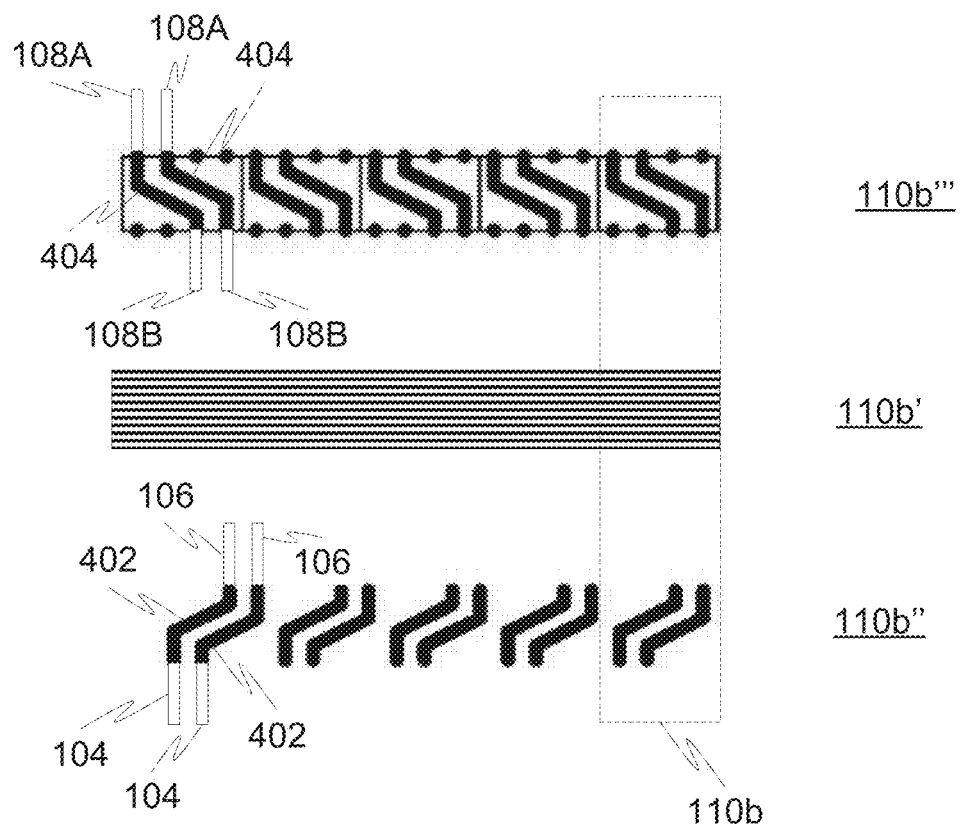
FIG. 6 shows exemplary coupling location enhancement elements according to embodiments of the invention.
Figure 6:
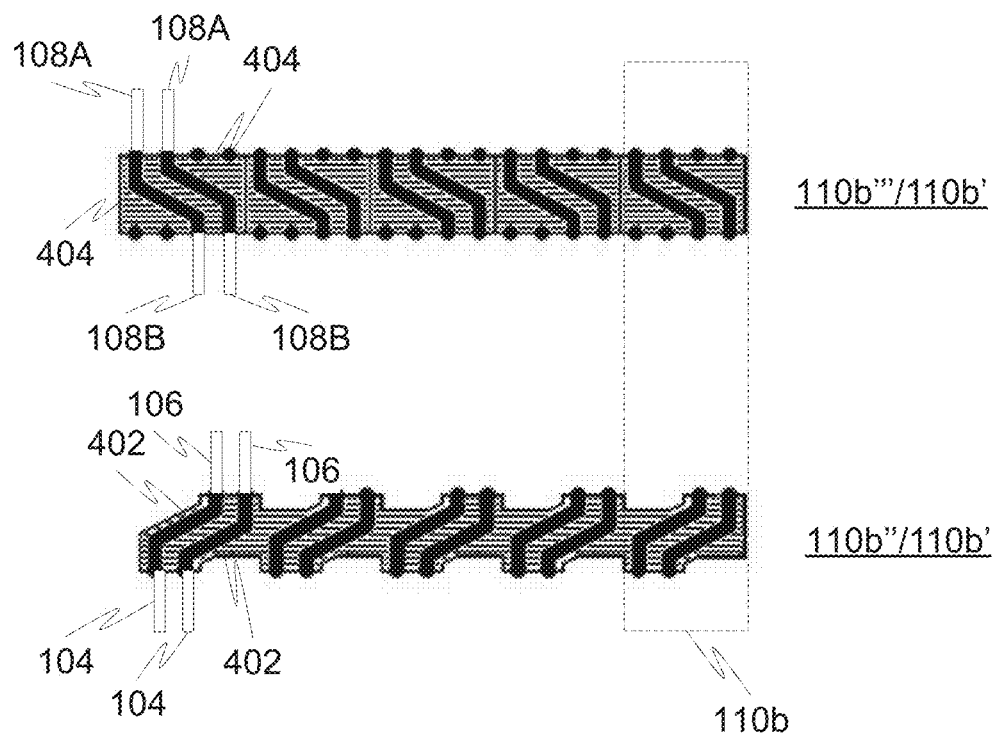

FIG. 6 shows layers of alternative coupling location enhancement elements 110b comprising multilayer substructures with at least one insulating layer 110b' disposed between (outer) top and bottom conductive layers 110b" and 110b'". The embodiment of FIG. 6 may differ from the previously presented coupling location enhancement element of FIGS. 4-5 in terms of materials and production methods.

FIG. 6A shows separate layers of a bottom (outer) conductive layer 110b'", insulating layer 110b' and top (outer) conductive layer 110b".

In one embodiment, a bottom conductive layer 110b'" may be a printed conductive layer, such that e.g. at least bottom extension elements 404 are printed.

The insulating layer 110b' may be a laminated insulating layer. An insulating layer 110b' may comprise thermoplastic material, preferably thermoformable material, in some embodiments. The insulating layer 110b' may be disposed over the bottom conductive layer 110b'". Adhesive may be used in some embodiments in the lamination process step.

In embodiments where the insulating layer 110b' comprises thermoformable material, the manufacturing process may comprise a step of thermoforming the at least the laminated insulating layer 110b', e.g. to planarize the structure.

Carrier film may be utilized or assembly to an SMD reel in various methods of producing the coupling location enhancement element 110b.

The top conductive layer 110b" may define at least one top extension element 402 configured to extend between the first conductive element 104 and second conductive element 106 to provide the electrical connection between the first conductive element 104 and second conductive element 106. FIG. 6A shows schematically how first conductive elements 104 and second conductive elements 106 may be provided in connection with the top extension elements 402. It could be considered that, at least after manufacturing the multilayer structure 100, the first conductive element 104, second conductive element 106, and top extension element 402 together form an integrated body or one element.

A top conductive layer 110b" may be a printed conductive layer that may be printed onto the insulating layer 110b' which has been disposed over the bottom conductive layer 110b'".

A portion of the layers indicated by a dashed rectangle may represent one embodiment of a single coupling location enhancement element 110b. Any number of such coupling location enhancement elements 110b may be produced simultaneously through embodiments of a method according to the present invention.

The example of FIG. 6A shows a 1 by 5 matrix of coupling location enhancement elements 110b that may be manufactured simultaneously and then e.g. cut to provide the separate coupling location enhancement elements 110b. Also matrices of other dimensions are possible.

The example of FIG. 6 depicts single coupling location enhancement elements 110b with 2×2 topology, where each single coupling location enhancement element 110b is associated with two first conductive elements 104, two second conductive elements 106, and two subsidiary conductive elements 108. Numerous types of other topologies may also be provided, such as 1×1, 1×3, 3×3, 3×1, to give a few examples.

A coupling location enhancement element 110b may then, as discussed, be provided onto the substrate film 102 using a standard SMD feeder, for instance. The other constituents of the multilayer structure 100 may have been provided on the substrate 102 prior to or simultaneously to mounting of the coupling location enhancement element 110b or e.g. conductive elements such as conductors may be printed onto the substrate film 102 after provision of the at least one coupling location enhancement element 110b.

Methods of manufacturing a multilayer structure 100 with the coupling location enhancement element 110b comprising multilayer substructure may be advantageous if the used materials in the rest of the multilayer structure 100 are at least partially the same or similar to those used in the coupling location enhancement elements 110b. For instance, printed conductors or printed conductive layers may use the same materials and/or a substrate film 102 may comprise the same material that is used for an insulating layer 110b'. In the described method where an insulating layer may be disposed by e.g. laminating, printing of insulator material may be avoided. Printed insulator structures may suffer from poor reliability.

The example of FIG. 6 shows coupling location enhancement elements 110b that may function as crossover elements that additionally provide a transformation of topography, or act as a junction station. A topography may be altered from a first topography to a second topography at the coupling location.

In the example of FIG. 6, the mutual configuration of the subsidiary conductive element 108 and a body formed by the first conductive element 104, second conductive element 106, and top extension element 402 is altered, such that on one side of the coupling location enhancement element 110b on the substrate film 102, the ordering of said body and subsidiary conductive element 108 is different from the order on another side of the coupling location enhancement element 110b.

The alteration of topography as seen in FIG. 6 may also be provided with coupling location enhancement elements 110b of FIGS. 4-5.

FIG. 6B shows an example of a multilayer substructure, where a bottom conductive layer 110b''' has been provided in conjunction with an insulating layer 110b'. A top conductive layer 110b'' has been provided in conjunction with a respective insulating layer 110b'.

In the embodiment of FIG. 6B, the bottom conductive layer 110b''' and its insulating layer 110b' may be produced separately and the top conductive layer 110b'' and its respective insulating layer 110b' may be produced separately. The two layers may then be joined by laminating the top layer to the bottom layer to provide the coupling location enhancement elements 110b. After provision of the coupling location enhancement elements 110b, it may be considered that the respective insulating layers 110b' of the bottom conductive layer 110b''' and top conductive layer 110b'' form one insulating layer 110b' of the multilayer substructure of the coupling location enhancement elements 110b.

In one embodiment of a coupling location enhancement element 110, 110b (not depicted), the coupling location enhancement element may comprise a multilayer substructure with at least one insulating layer disposed between (outer) top and bottom conductive layers, wherein at least the insulating layer comprises or consists of adhesive material, and optionally also the conductive layers may comprise or essentially consist of adhesive material. Such embodiments may in particular provide benefits over previously considered printed dielectric stack structures as crossover components. Here, a layer thickness between the electrically conductive layers may be made much larger than in dielectric stacks, whereby the risk of breakthrough may be reduced. In comparison to solutions where a coupling location enhancement element comprises e.g. an SMD component, the coupling that is made between the coupling location enhancement element and the first conductive element, second conductive element, and/or subsidiary conductive element may be more reliable.

In an embodiment where at least the insulating layer comprises adhesive material, the structure of the coupling location enhancement element 110, 110b may correspond to that considered in connection with FIGS. 4-6, at least in the sense that it may comprise a top conductive layer that may define at least one top extension element, configured to extend between the first conductive element 104 and second conductive element 106 to provide the electrical connection between the first conductive element 104 and second conductive element 106. The coupling location enhancement element 110, 110b may additionally comprise a bottom conductive layer that may define at least one bottom extension element configured to provide an electrical connection between a first portion and a second portion of a subsidiary conductive element 108.

Yet, in contrast to some embodiments that may be considered in connection with FIGS. 4-6, a coupling location enhancement element 110 where at least the insulating layer comprises adhesive material may be manufactured differently. Here, instead of producing the coupling location enhancement element separately before providing it to the substrate film, it may be manufactured directly onto the substrate while manufacturing the multilayer structure.

First conductive element 104, second conductive element 106, and first and second portions of subsidiary conductive element 108A, 108B may be provided to the substrate film 102 before, after or during provision of the coupling location enhancement element 110, 110b. The coupling location enhancement element 110, 110b may be provided by first providing a bottom conductive layer to the substrate film to form at least one bottom extension element, wherein the bottom conductive layer may comprise e.g. conductive ink or conductive adhesive. The insulating layer may be provided on top of the bottom conductive layer. wherein the insulating layer comprises or consists of a structural adhesive. A top conductive layer may thereafter be provided on top of the insulating layer to form at least one top extension element, wherein the top conductive layer may comprise e.g. conductive ink or conductive adhesive. The layers may be provided using methods such as jetting.

The above considered approach may not add any process phases to production of a multilayer structure, such as IMSE production process. Therefore, no further costs of providing a separate coupling location enhancement element 110, 110b may be incurred. The application of an insulating layer comprising e.g. structural adhesive may be especially suitable for solutions which comprise a number of crossover structures that are required. The solution may reduce production time and/or complexity by reducing required printed layers and/or components.

A coupling location enhancement element 110, 110b wherein at least the insulating layer comprises or consists of adhesive material may also comprise any required number of further insulating and conductive layers (each layer or at least each insulating layer comprising adhesive material such as structural adhesive) to provide crossover elements in relation to further first conductive elements 104, second conductive elements 106, and/or subsidiary conductive elements 108 (or portions thereof). Also here, transformations of topology may be considered.

Figure 7:
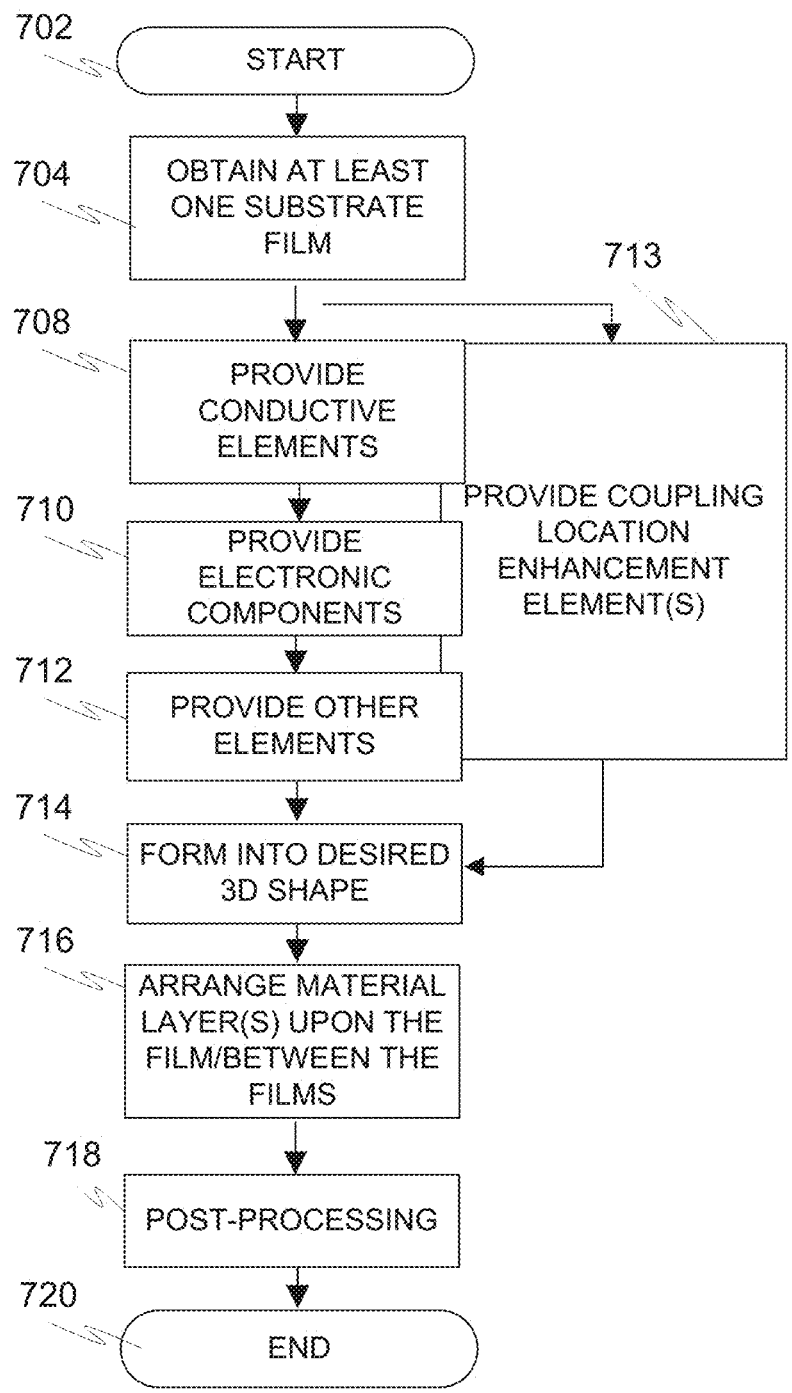
FIG. 7 gives a flow chart of a method according to one embodiment of the invention.

FIG. 7 is a flow diagram of an embodiment of a method in accordance with the present invention. At the beginning of the method for manufacturing a multilayer structure 100, a start-up phase 702 may be executed. During start-up, tasks such as material, for example substrates, component and tools selection, acquisition, calibration and other configuration tasks may take place. It may be ensured, for instance, that individual elements and material selections work together and survive the selected manufacturing and installation process. Selections may be checked e.g. on the basis of the manufacturing process specifications and component data sheets, or by investigating and testing the produced prototypes. The used equipment such as molding/IMD (in-mold decoration), lamination, bonding, (thermo)forming, electronics assembly, cut-ting, drilling and/or printing equipment, among others, may be thus ramped up to operational status at this stage.

Step 704 may refer to obtaining a substrate film comprising formable, optionally thermoformable, material.

Steps 708, 710, 712 may refer to providing a number of functional elements, including at least a first conductive element, second conductive element, and subsidiary conductive element, on the substrate film. Some of the conductive elements may be portions of the same conductive entity. As an example, the first conductive element, second conductive element, and subsidiary conductive element may all be portions of an inductor, which has at least one coupling location where the inductor portions may cross each other upon the substrate film.

At step 713, the substrate film may be further provided with a coupling location enhancement element at a coupling location, being configured to provide an electrical connection between the first conductive element and second conductive element, further wherein said coupling location enhancement element is configured to inhibit coupling between the first conductive element and the subsidiary conductive element at the coupling location and between the second conductive element and the subsidiary conductive element at the coupling location. This step may be performed prior to, simultaneously, or after any or all of the steps 708, 710, 712. Prior to step 713, in some embodiments the method may comprise a separate step of manufacturing the coupling location enhancement element(s) e.g. utilizing printing technologies, lamination, or etching, for instance.

In various embodiments, the method may further comprise, e.g. before or after step 713, forming 714 the substrate film to exhibit a selected three-dimensional non-flat shape, for instance in the proximity of the functional elements. The forming 714 may include thermoforming, vacuum forming, high pressure forming, or cold forming, for instance.

In various embodiments, the method may comprise producing 716, preferably by molding, such as injection molding, or casting, at least one plastic layer upon the substrate film, at least partially embedding one or more of the functional elements and/or the coupling location enhancement element therewithin.

Still further, in various embodiments, the method may comprise post-processing 718 of the multilayer structure 100. This may mean, for example, cutting certain parts thereof, cutting it, installing it to a host device, or other known post-processing tasks appreciated by a skilled person.

At 720, method execution is ended.

The scope of the present invention is determined by the attached claims together with the equivalents thereof. A person skilled in the art will appreciate the fact that the disclosed embodiments were constructed for illustrative purposes only, and other arrangements applying many of the above principles could be readily prepared to best suit each potential use scenario.

The invention claimed is:

1. A multilayer structure, comprising:
a substrate film; and
a number of functional elements comprising at least one first conductive element, at least one second conductive element, and at least one subsidiary conductive element provided upon the substrate film;
wherein the substrate film has been provided with at least one coupling location enhancement element at a coupling location with respect to the substrate film,
wherein at said coupling location the coupling location enhancement element is configured to provide an electrical connection between the first conductive element and second conductive element, and
wherein said coupling location enhancement element is configured to inhibit coupling between the first conductive element and the subsidiary conductive element at the coupling location and between the second conductive element and the subsidiary conductive element at the coupling location.

2. The structure of claim 1, wherein the substrate film comprises a formable material selected from thermoformable polymer, PMMA (Polymethyl methacrylate), Poly Carbonate (PC), copolyester, copolyester resin, polyimide, a copolymer of Methyl Methacrylate and Styrene (MS resin), glass, and/or Polyethylene Terephthalate (PET).

3. The structure of claim 1, wherein the substrate film comprises a selected three-dimensional, optimally thermoformed, non-flat shape.

4. The structure of claim 3, wherein the coupling location enhancement element is configured to at least one of control the deformation of the substrate within a proximity of the three-dimensional non-flat shape, and control over the distribution of deforming forces in selected directions.

5. The structure of claim 1, wherein the coupling location enhancement element comprises at least one of said functional elements.

6. The structure of claim 5, wherein the coupling location enhancement element comprises at least one of a resistor, a ferrite bead, a light source such as light-emitting diode (LED) or a capacitor.

7. The structure of claim 5, wherein the structure comprises a plurality of coupling location enhancement elements providing a collective activity.

8. The structure of claim 1, wherein the coupling location enhancement element comprises at least one of thermoplastic material or thermoformable material.

9. The structure of claim 1, wherein the coupling location enhancement element comprises a multilayer substructure comprising at least one conductive layer and at least one insulating layer, said layers being disposed essentially codirectionally with the substrate film at the coupling location.

10. The structure of claim 9, wherein the multilayer substructure comprises at least one insulating layer disposed between outer conductive layers.

11. The structure of claim 10, wherein said outer conductive layers define at least one top extension element and at least one bottom extension element, wherein said top extension element is configured to extend between the first conductive element and second conductive element to provide the electrical connection between the first conductive element and second conductive element, wherein the subsidiary conductive element comprises a first portion and a second portion, and wherein the bottom extension element is configured to provide an electrical connection between the first portion and second portion.

12. The structure of claim 9, wherein said multilayer substructure comprises castellations at one or more edges of the multilayer substructure.

13. The structure of claim 9, wherein the insulating layer comprises at least one of thermoplastic material or thermoformable material.

14. The structure of claim 9, wherein at least one of the insulating layer and the conductive layers comprise adhesive material.

15. The structure of claim 1, wherein the coupling location enhancement element is shaped to provide a gap between the substrate film and the coupling location enhancement element at said coupling location.

16. The structure of claim 1, wherein the coupling location enhancement element is provided in connection with a cohesion maintaining element, said cohesion maintaining element comprising an adhesive material and being provided to contact at least one of the coupling location enhancement element, the substrate film, and the subsidiary conductive element.

17. The structure of claim 16, wherein the cohesion maintaining element is adapted to extend along the substrate film beyond borders of at least one of the coupling location enhancement element and the subsidiary conductive element.

18. The structure of claim 1, wherein the coupling location enhancement element comprises at least one passive SMD component.

19. The structure of claim 1, wherein the coupling location enhancement element is configured to provide a transformation of topography, such that a topography of at least one of the first conductive element, second conductive element and subsidiary conductive element is altered from a first topography to a second topography at the coupling location.

20. A method of producing a multilayer structure, comprising:
   obtaining a substrate film;
   providing a number of functional elements on the substrate film, wherein the functional elements comprise at least one first conductive element, at least one second conductive element, and at least one subsidiary conductive element; and
   wherein the substrate film is further provided with a coupling location enhancement element at a coupling location with respect to the substrate film, said coupling location enhancement element being configured to provide an electrical connection between the first conductive element and second conductive element, and
   wherein said coupling location enhancement element is configured to inhibit coupling between the first conductive element and the subsidiary conductive element at the coupling location and between the second conductive element and the subsidiary conductive element at the coupling location.

* * * * *